United States Patent [19]
Hayden

[11] Patent Number: 5,194,926
[45] Date of Patent: Mar. 16, 1993

[54] SEMICONDUCTOR DEVICE HAVING AN INVERSE-T BIPOLAR TRANSISTOR

[75] Inventor: James D. Hayden, Austin, Tex.

[73] Assignee: Motorola Inc., Schaumburg, Ill.

[21] Appl. No.: 770,219

[22] Filed: Oct. 3, 1991

[51] Int. Cl.$^5$ .................. H01L 21/263; H01L 21/265; H01L 29/72
[52] U.S. Cl. ...................................... 257/565; 437/31; 437/26; 437/32; 257/587; 257/588
[58] Field of Search ....................... 357/34, 35; 437/31, 437/26, 32

[56] References Cited

U.S. PATENT DOCUMENTS

| | | | |
|---|---|---|---|
| 4,847,670 | 7/1989 | Monkowski et al. | 357/34 |
| 4,963,957 | 10/1990 | Ohi et al. | 351/34 |
| 4,975,385 | 12/1990 | Beinglass et al. | 437/29 |
| 4,984,042 | 1/1991 | Pfiester et al. | 357/23.9 |
| 4,988,632 | 1/1991 | Pfiester | 437/71 |
| 5,010,026 | 4/1991 | Gomi | 357/34 |
| 5,047,823 | 9/1991 | Treitinger et al. | 357/34 |
| 5,049,964 | 9/1991 | Sakai et al. | 357/34 |
| 5,065,210 | 11/1991 | Hirakawa | 357/34 |
| 5,077,227 | 12/1991 | Kameyana et al. | 357/34 |

OTHER PUBLICATIONS

"A Novel Submicron LDD Transistor with Inverse-T Gate Structure," by T. Huang et al., Technical Digest of the International Electron Devices Meeting, 1986, article 31.7, pp. 742-745.

"Single Polysilicon Layer Advanced Super High-Speed BiCMOS Technology," by J. L. de Jong et al. Proceedings of the 1989 Bipolar Circuits and Technology Meeting, Sponsored by IEEE, Sep. 18-19, 1989, Minneapolis, Minn., Paper 7.4, pp. 182-185.

Primary Examiner—Eugene R. LaRoche
Assistant Examiner—Viet Q. Nguyen
Attorney, Agent, or Firm—Patricia S. Goddard

[57] ABSTRACT

A bipolar transistor having an inverse-T emitter electrode is formed in a semiconductor device (10) to reduce hot carrier injection (HCI) damage under reverse-biasing conditions and to increase emitter-base breakdown voltages. The bipolar transistor includes an emitter electrode having a central body portion (26) and shelf portions (38). Beneath the emitter electrode is an emitter region (30) and an active base region (25). Extrinsic base regions (35 and 36) are self-aligned to the shelf edges and are linked to the ative base region by link regions (27 and 28). Having the emitter-base junction beneath the shelf portions, and therefore under direct control of the emitter electrode, decreases the electrical field at the junction, which lessens HCI damage and improves breakdown characteristics. The inverse-T emitter electrode also eliminates the need to etch a polysilicon emitter electrode selective to an underlying silicon substrate.

14 Claims, 2 Drawing Sheets

SEMICONDUCTOR DEVICE HAVING AN INVERSE-T BIPOLAR TRANSISTOR

CROSS-REFERENCE TO RELATED APPLICATION

The present application is related to a commonly assigned co-pending patent application by J. Pfiester entitled "A SEMICONDUCTOR DEVICE HAVING AN MOS TRANSISTOR WITH OVERLAPPED AND ELEVATED SOURCE AND DRAIN," Ser. No. 07/753,500, filed Sep. 3, 1991.

FIELD OF THE INVENTION

The present invention relates to semiconductor devices in general, and more specifically to semiconductor devices having bipolar transistors and processes for making the same.

BACKGROUND OF THE INVENTION

Bipolar transistors have been used in semiconductor devices for quite some time and are becoming more and more common with an increasing popularity of BiCMOS (bipolar-complementary metal oxide semiconductor) devices. In BiCMOS devices, bipolar transistors and CMOS transistors are fabricated together in a single semiconductor device. To simplify BiCMOS device fabrication, it is advantageous to integrate as many CMOS processing steps with bipolar processing steps as possible.

A bipolar transistor structure which can be easily integrated into a traditional CMOS process is a single polysilicon bipolar transistor with self-aligned base and emitter regions. This bipolar transistor, which will hereinafter be described as an NPN bipolar transistor, includes a polysilicon emitter electrode which is formed on a P− active base region of a substrate. The polysilicon is doped with N-type impurities such that an N+ emitter region is formed in the active base region, aligned to the emitter electrode, as a result of out-diffusion. A link implant is performed to form P− link regions in the substrate which are aligned to edges of the emitter electrode and are contiguous with the active base region. Sidewall spacers are then formed along edges of the emitter electrode, and a P+ implant is used to form extrinsic base regions which are aligned to the sidewall spacers and are contiguous with the link regions.

The above bipolar transistor is easily incorporated into a CMOS process; however, there are a few disadvantages in using this bipolar transistor. From a fabrication point of view, the single polysilicon bipolar transistor requires a difficult etch process, namely that of etching the polysilicon emitter electrode selective to an underlying silicon substrate. Etching polysilicon selective to silicon is nearly impossible to do with existing technology without trenching portions of the silicon substrate. With respect to electrical performance and reliability, the single polysilicon bipolar transistor has unfavorably low emitter-base breakdown voltages because the N+ emitter region and P− link region often laterally diffuse into one another. Another disadvantage is that under reverse-bias conditions, the single polysilicon bipolar transistor is susceptible to HCI (hot carrier injection) damage due to high electric fields at the emitter-base junction, leading to a reduction in gain (also known as β degradation).

A further limitation to the single polysilicon bipolar transistor is a restricted ability to scale the transistor. Following the overall trend in the semiconductor industry, dimensions of bipolar transistors will continue to be reduced. Accordingly, doping levels of the active base, extrinsic base, emitter, and link regions will increase in order to maintain existing levels of performance. However, as doping levels increase, the aforementioned problems will worsen. More specifically, emitter-base breakdown voltages will become lower, while damage due to HCI will increase. Reducing the size of the transistors will cause sidewall spacers used to align the extrinsic base region to be made narrower. The extrinsic base region, as a result, will be brought in closer to the emitter region, thereby further lowering emitter-base breakdown voltages and further increasing electric fields at the emitter-base junction.

SUMMARY OF THE INVENTION

Many of the problems associated with existing bipolar transistors, including those described above, are overcome by the present invention. In one embodiment, a semiconductor device includes an inverse-T bipolar transistor. The device includes a semiconductor substrate which is of a first conductivity. An inverse-T emitter electrode overlies the substrate such that a body portion of the inverse-T emitter electrode is formed on the substrate, and a shelf portion of the inverse-T emitter electrode is separated from the substrate by a dielectric. An active base region of a second conductivity is formed in the substrate beneath the body portion of the emitter electrode, and an emitter region of the first conductivity is formed within the active base region and in electrical contact with the emitter electrode. A link region of the second conductivity is formed in the substrate beneath the shelf portion of the emitter electrode. The device also includes an extrinsic base region of the second conductivity formed in the substrate adjacent the link region and aligned to an edge of the shelf portion of the emitter electrode. A process for forming the semiconductor device is also taught.

These and other features, and advantages, will be more clearly understood from the following detailed description taken in conjunction with the accompanying drawings. It is important to note the drawings are not necessarily drawn to scale and are not intended to represent the only form of the invention.

DETAILED DESCRIPTION OF A PREFERRED EMBODIMENT

The present invention provides a semiconductor device having an inverse-T bipolar transistor, or more specifically a bipolar transistor having an inverse-T emitter electrode. The inverse-T emitter electrode is formed of a central body portion and has wings or shelves which extend from each side of the central body. One advantage of utilizing an inverse-T emitter electrode in the bipolar transistor is that an emitter-base junction is formed beneath the shelf of the inverse-T structure. Having the shelf of the emitter electrode overlying the emitter-base junction enables the emitter electrode to lower the lateral electric field at the junction under reverse bias conditions, thereby lowering the extent of hot carrier injection (HCI) damage. Also, the fact that the emitter-base junction is beneath a portion of the emitter electrode increases the emitter-base breakdown voltage in comparison to known bipolar transistors which do not have junctions under direct emitter electrode control. The present invention also has an advantage with respect to fabrication of a bipolar transistor. In practicing the invention, it is not necessary to etch polysilicon selective to a silicon substrate, as required by many existing bipolar processes.

FIGS. 1-6 are a series of cross-sectional illustrations which represent a method for fabricating a bipolar transistor in a semiconductor device 10, in accordance with the invention. While the illustrations are directed to fabricating an NPN bipolar transistor, it is important to realize that a PNP bipolar may also be fabricated by altering dopant types. Furthermore, although only a bipolar transistor of the device is illustrated, one may also fabricate an MOS transistor simultaneously with the bipolar transistor. Thus, the present invention is readily suited for use in BiCMOS devices, particularly those devices which include inverse-T CMOS transistors.

Figure 1:
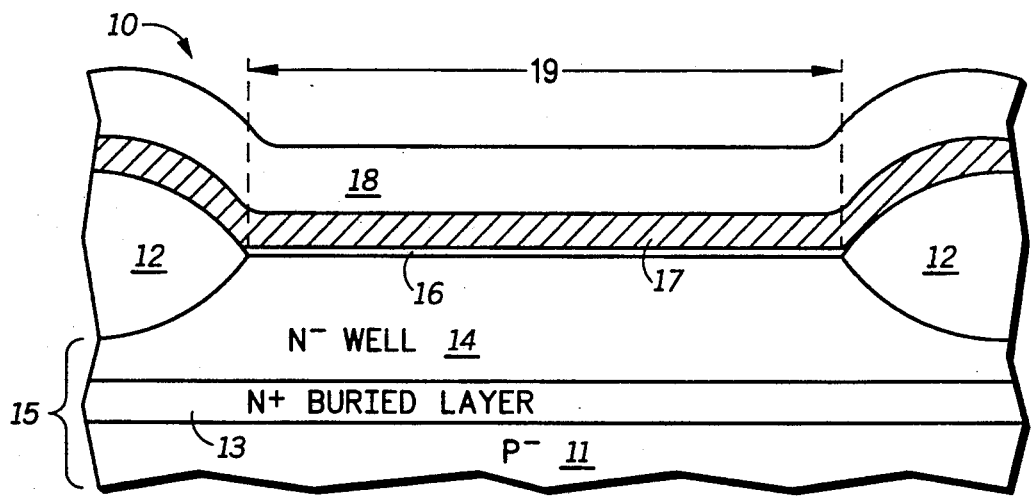
FIGS. 1-6 are cross-sectional illustrations depicting the fabrication of a portion of a semiconductor device having an inverse-T bipolar transistor, in accordance with the present invention.

FIG. 1 illustrates an initial structure which is suitable for implementing the present invention. A portion of semiconductor device 10 includes a monocrystalline silicon substrate 11 which is lightly doped with a P-type impurity and is thus labeled "P−". An N+ buried layer 13 is formed in substrate 11 by doping the substrate with an N-type impurity by, for example, diffusion or ion implantation of arsenic or phosphorus. Following formation of buried layer 13, an epitaxial silicon layer is grown to form a well 14 which incorporates some of the dopants from buried layer 13 and is thus labeled "N−WELL". In order to achieve a particular doping concentration in well 14, the epitaxial layer may be doped separately, for instance by a blanket ion implantation, rather than relying upon diffusion from the buried layer. Silicon substrate 11, buried layer 13, and well 14 collectively form a semiconductor substrate 15.

As FIG. 1 also illustrates, field oxide regions 12 are formed in device 10 to define an active region 19 within semiconductor substrate 15. Field oxide regions 12 may be formed using any of the available isolation techniques, for example the conventional LOCOS (localized oxidation of silicon) technique. A thin dielectric layer 16 is formed on active region 19 of semiconductor substrate 15. Dielectric layer 16 is preferably grown by thermally oxidizing the epitaxial silicon layer used to form well 14 and is usually on the order of 100-300Å (10-30 nm) thick. After forming dielectric layer 16, a polysilicon layer 17 is deposited on the device. While conceivably any conductive material could be used in place of polysilicon layer 17, polysilicon is a preferred material due to the fact that most semiconductor substrates will be of silicon and the fact that polysilicon is an extensively used material in the semiconductor industry. The thickness of polysilicon layer 17 should be thin enough to allow impurity atoms to be implanted through the layer into substrate 15 without an unreasonably high implant energy. A preferred thickness range for polysilicon layer 17 is between 200 and 700Å (20-70 nm). Formed above polysilicon layer 17 is a masking layer 18. Masking layer 18 may be, for example, a TEOS (tetra-ethyl-ortho-silicate) layer, or any other material which has the ability to be etched selectively to polysilicon layer 17 and semiconductor substrate 15.

Reasons why masking layer 18 must have the ability to be etched selectively to polysilicon layer 17 and substrate 15 will become evident below. A reasonable masking layer thickness is between 3000 and 6000Å (300-600 nm).

Figure 2:
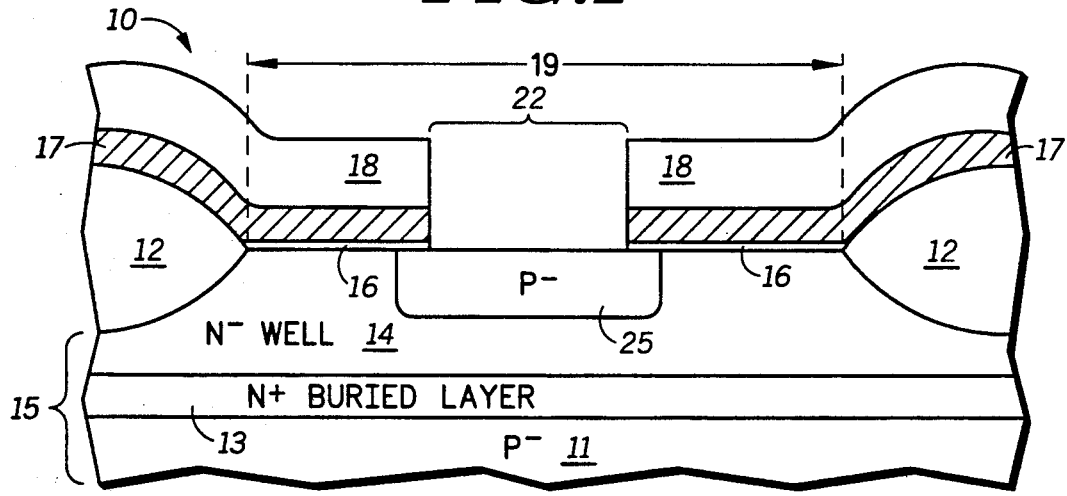

After an initial structure, such as that illustrated in FIG. 1, is formed, an opening 22 is formed in each of masking layer 18, polysilicon layer 17, and dielectric layer 16 to expose a portion of active region 19, as illustrated in FIG. 2. Opening 22 is formed in a conventional manner, for example by forming a photoresist mask pattern (not shown) and transferring the mask pattern into the underlying layers using a series of known etches. Once a portion of the active region is exposed, device 10 is subjected to a P− implant, such as a boron implant, to form an active base region 25 within active region 19. Active base region 25 aligns to opening 22; however, lateral out-diffusion of the impurity atoms will result in active base region 25 extending beyond the opening, as illustrated in FIG. 2. Suitable doping levels for active base region 25 are comparable to those used in existing bipolar transistors.

Figure 3:
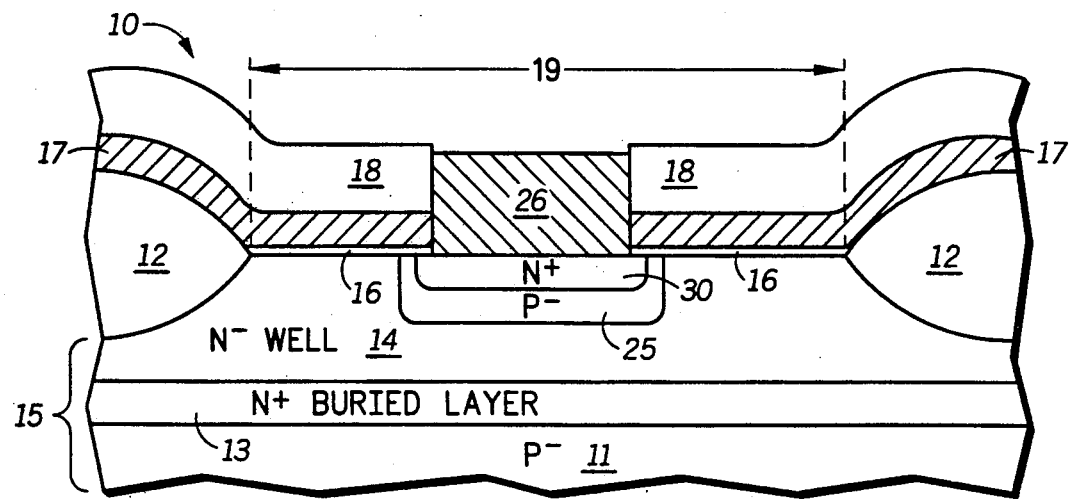

As illustrated in FIG. 3, an emitter electrode 26 is formed on active base region 25, substantially filling opening 22. Emitter electrode 26 is preferably formed by selective deposition. Selective deposition is a process of chemical vapor deposition in which the reaction is adjusted so that a material is deposited only on a prepared nucleation site. In the case of selective deposition of silicon, which is a preferred embodiment of the present invention, exposed portions of polycrystalline or monocrystalline silicon act as the nucleation site for deposition. With continued deposition, the selectively deposited silicon itself acts as a nucleating site so that additional silicon deposits on earlier deposits to extend silicon upwardly within opening 22. The selectively deposited emitter electrode is self-aligned because it deposits only on the exposed portion of substrate 15, namely on active base region 25. While selective deposition of silicon is more common than selective deposition of tungsten, aluminum, platinum, or the like, these materials can also be used in accordance with the present invention. Furthermore, as an alternative to selective deposition, a thick conductive material may be deposited on device 10, filling opening 22, and subsequently etched back to form emitter electrode 26.

In choosing materials for emitter electrode 26 and (polysilicon) layer 17, a variety of materials are suited for use with the invention. For example, tungsten, titanium nitride, silicides, and the like may be used. Furthermore, the material chosen for emitter electrode 26 need not be the same as that chosen for layer 17. It is, however, important that emitter electrode 26, no matter how formed, be in reasonably good electrical contact with layer 17, for reasons which will become evident below.

Beneath emitter electrode 26, an N+ emitter region 30 is formed within active base region 25, as FIG. 3 illustrates. Emitter region 30 is created as a result of out-diffusion of N-type impurity atoms in emitter electrode 26. The impurity atoms may be incorporated into the emitter electrode during deposition, a process known as in-situ doping. Alternatively, the emitter electrode may be doped using ion implantation. In either case, impurity atoms in emitter electrode 26 will diffuse into the underlying silicon substrate, and to some extent into polysilicon layer 17, to form emitter region 30. During doping of the emitter electrode, masking layer 18 prevents other portions of device 10 from incorporating the N-type dopant. As with active base region 25, emitter region 30 will also laterally diffuse, such that the diffused region will extend beyond edges of emitter electrode 26. Doping levels of emitter region 30 are comparable to emitter doping levels in known bipolar devices.

Figure 4:
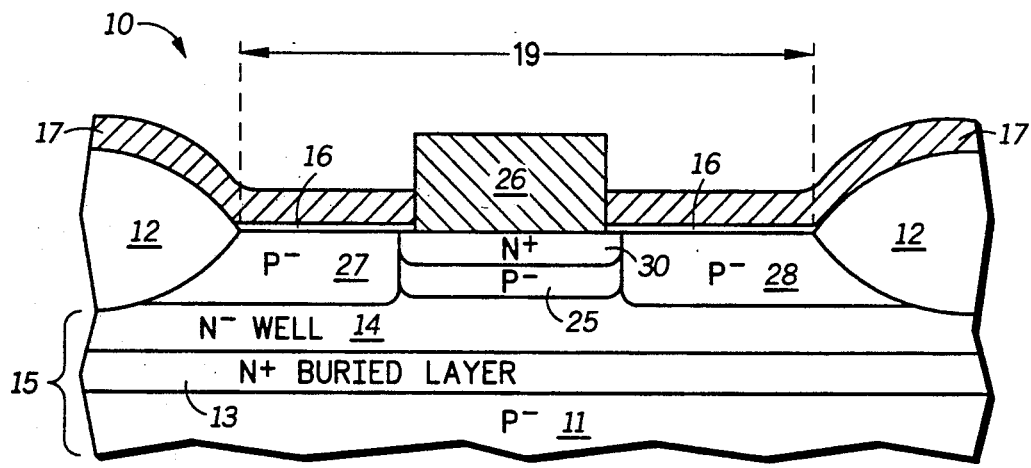

Following formation of emitter electrode 26 and emitter region 30, masking layer 18 is removed from the device. In order to leave emitter electrode 26 and polysilicon layer 17 unaffected during removal of masking layer 18, the masking layer material should be chosen such that a selective etch is possible. After removing masking layer 18, device 10 is subjected to a P−implant to form first and second link regions, 27 and 28 respectively, as illustrated in FIG. 4. Link implants are well known in bipolar transistor technology. The present invention may use link implant dosages similar to those used in known devices. The impurity atoms from the link implant are implanted through polysilicon layer 17 and dielectric layer 16 to form the link regions in the substrate. No masking step is required in forming link regions 27 and 28. Although P-type impurity atoms will also be implanted into portions of the N+ emitter region, an emitter region is typically doped to a high enough concentration that a link implant will not significantly affect the emitter region. Nor will the link implant negatively impact active base region 25 since both the link regions and the active base region are P-type. Although the actual link regions may not extend to the edge of emitter electrode 26, the link implant is considered to be self-aligned to the emitter electrode since no masking step is required. The link implant is also self-aligned with respect to active base region 25.

Figure 5:
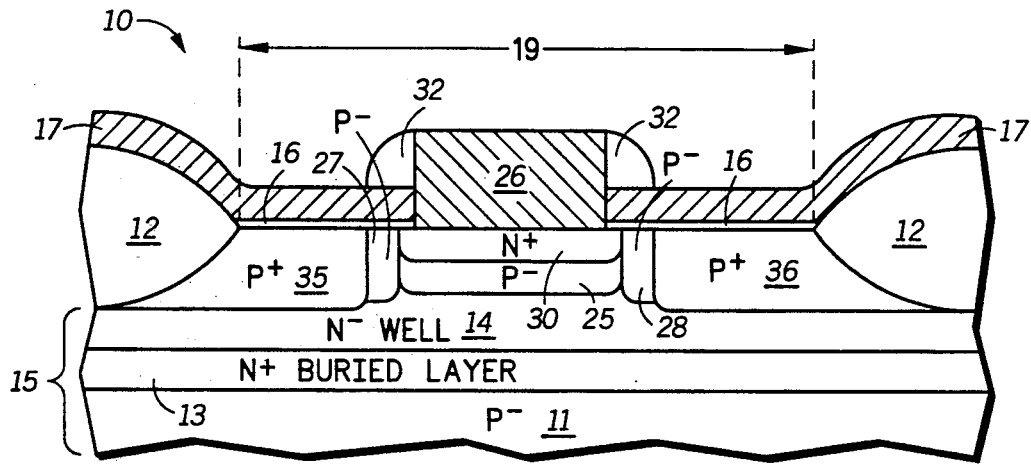

First and second extrinsic base regions 35 and 36 are formed in device 10 with another self-aligned implant step, as FIG. 5 illustrates. To form the extrinsic base regions, dielectric sidewall spacers 32 are formed in a conventional manner along edges of emitter electrode 26 and on top of polysilicon layer 17. A blanket P+ implant is then performed to achieve a common impurity concentration for the extrinsic base regions. During implantation, emitter electrode 26 and sidewall spacers 32 prevent emitter region 30 from being doped further while sidewall spacers 32 prevent additional doping of link regions 27 and 28. Thus, extrinsic base regions 35 and 36 are self-aligned to the sidewall spacers.

Figure 6:
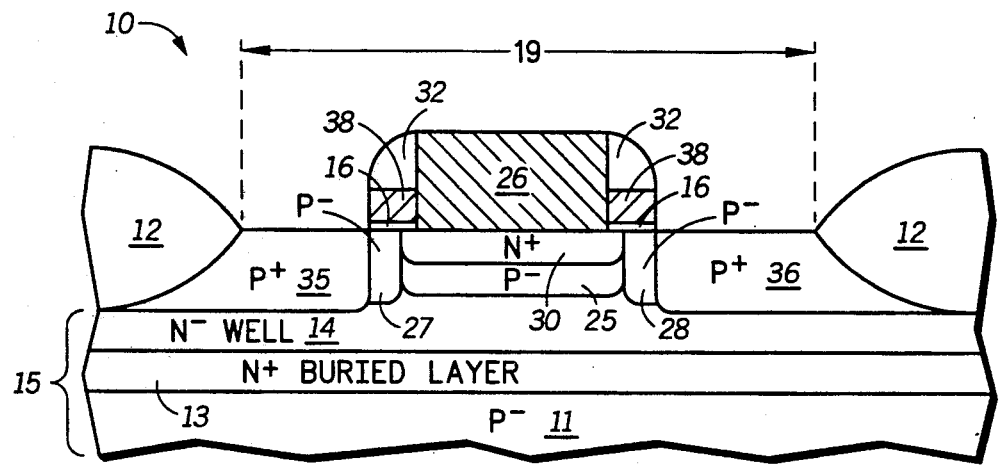

Sidewall spacers 32 also serve as an etch mask during removal of polysilicon layer 17 and dielectric layer 16, as FIG. 6 illustrates. After formation of extrinsic base regions 35 and 36, polysilicon layer 17 and dielectric layer 16 are removed, with the exception of those portions of the layers which are protected by the sidewall spacers. Those portions of the polysilicon layer which are protected remain a part of device 10 and function as part of the emitter electrode. In particular, the emitter electrode 26 is formed of a central portion, which is formed, for example, by selective deposition of silicon. The emitter electrode further has shelf portions 38 which are formed by masking these portions, for instance with sidewall spacers 32, during removal of polysilicon layer 17. The composite emitter electrode is similar in appearance to an up-side-down "T", and is thus referred to as an inverse-T emitter electrode.

Utilizing an inverse-T emitter electrode has several advantages over existing bipolar transistors, particularly existing bipolar transistors which are formed using only a single layer of polysilicon. One advantage is that by using an inverse-T emitter electrode, such as that illustrated in FIG. 6, electric fields at the emitter-base junction are kept low since the junction lies beneath shelf portions 38 of the emitter electrode. Therefore, under reverse biasing conditions, the extent of HCI damage is reduced. Furthermore, the fact that the emitter-base junction lies under the shelf portions leads to an increase in emitter-base breakdown voltage since the junction is under the control of the emitter electrode. Yet another advantage is that fabrication of device 10 does not require etching polysilicon layer 17 selectively to a silicon substrate. As illustrated in FIGS. 5 and 6, removal of polysilicon layer 17 can be accomplished by etching the polysilicon layer selective to dielectric layer 16, rather than selectively to a silicon substrate as required in many known bipolar processes.

Rather than forming extrinsic base regions 35 and 36 before etching polysilicon layer 17, the polysilicon layer could first be patterned and a P+ implant performed afterwards. In other words, the process could proceed as follows: after forming sidewall spacers 32, etch polysilicon layer 17 to form shelf portions 38; do a P+ implant to form extrinsic base regions 35 and 36; and remove dielectric layer 16 above the extrinsic base regions. By etching the polysilicon layer prior to doing the P+ implant, a lower energy implant is possible.

Completion of device 10 from the stage illustrated in FIG. 6 may be achieved according to known fabrication techniques and will, therefore, not be illustrated or described in detail. Device 10 as completed will include electrical contacts (not illustrated) to emitter electrode 26 and to extrinsic base regions 35 and 36. Furthermore, the device will probably have various other conductive and insulative layers, in addition to those illustrated in FIG. 6, which are typically used in semiconductor devices. Although not illustrated, the bipolar transistor may also have a collector region which electrically contacts buried layer 13 and an electrical contact to the collector region. The particular location of the collector region and method of forming the collector region is not important in understanding the present invention. Any existing type or method of forming a collector region may be used in conjunction with the invention.

Thus it is apparent that there has been provided, in accordance with the invention, a semiconductor device having an inverse-T bipolar transistor and process for making the same that fully meets the needs and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the present invention may be implemented in either an NPN or PNP bipolar transistor. Furthermore, a device in accordance with the invention need not strictly be a bipolar device, but may be a combination of a bipolar and an MOS or a CMOS device. In addition, the invention is not limited to the specific materials, deposition, etching, or implanting techniques described. Although preferred embodiments of the invention have been described, it is understood that alternative embodiments are also conceivable and considered within the scope of the invention. Therefore, it is intended that this invention encompass all such variations and modifications as fall within the scope of the appended claims.

I claim:

1. A semiconductor device having an inverse-T bipolar transistor comprising:
   a semiconductor substrate of a first conductivity;
   an inverse-T emitter electrode overlying the substrate, the inverse-T emitter electrode having a body portion and first and second shelf portions, the body portion being formed on the substrate and the first and second shelf portions being formed on opposing sides of the body portion and being separated from the substrate by a dielectric, wherein a portion of the body portion of the emitter electrode extends above the first and second shelf portions such as that the emitter electrode has an inverted "T" shape;
   an emitter region of the first conductivity formed in the substrate beneath the body portion of the inverse-T emitter electrode;
   an active base region of a second conductivity formed in the substrate beneath the emitter region;
   first and second lightly doped link regions of the second conductivity formed in the substrate on opposing sides of the body portion of the inverse-T emitter electrode beneath the first and second shelf portions, respectively; and
   first and second extrinsic base regions of the second conductivity formed in the substrate on opposing sides of the first and second shelf portions of the inverse-T emitter electrode and adjacent the first and second link portions, respectively.

2. The semiconductor device of claim 1 wherein the body portion of the inverse-T emitter electrode is formed of selectively deposited silicon.

3. The semiconductor device of claim 2 wherein the first and second shelf portions of the inverse-T emitter electrode are formed of polysilicon.

4. The semiconductor device of claim 1 further comprising first and second dielectric sidewall spacers formed on the first and second shelf portions of the inverse-T emitter electrode, respectively, each sidewall spacer being adjacent the body portion of the inverse-T emitter electrode.

5. The semiconductor device of claim 4 wherein the first and second extrinsic base regions are self-aligned to the first and second sidewall spacers, respectively.

6. The semiconductor device of claim 1 wherein the first and second link regions are self-aligned to the active base region and to an edge of the body portion of the emitter electrode.

7. A semiconductor device having an inverse-T bipolar transistor, comprising:
   a semiconductor substrate of a first conductivity;
   an inverse-T emitter electrode having a body portion formed on the substrate and a shelf portion overlying the substrate, the shelf portion being separated from the substrate by a dielectric, wherein a portion of the body portion of the emitter electrode extends above the shelf portion such that the emitter electrode has an inverted "T" shape;
   an active base region of a second conductivity formed in the substrate beneath the body portion of the emitter electrode;
   an emitter region of the first conductivity formed within the active base region and in electrical contact with the emitter electrode;
   a link region of the second conductivity formed in the substrate beneath the shelf portion of the emitter electrode; and
   an extrinsic base region of the second conductivity formed in the substrate adjacent the link region and aligned to an edge of the shelf portion of the emitter electrode.

8. The semiconductor device of claim 7 further comprising a junction between the active base region and the emitter region, the junction underlying the shelf portion of the emitter electrode.

9. The semiconductor device of claim 7 wherein the link region is self-aligned to the active base region and the body portion of the emitter electrode.

10. The semiconductor device of claim 7 wherein the body portion of the emitter electrode is formed of selectively deposited silicon.

11. The semiconductor device of claim 10 wherein the shelf portion of the emitter electrode is formed of polysilicon.

12. The semiconductor device of claim 1 wherein the dielectric which separates the first and second shelf portions from the substrate has a thickness on the order of 30 nm or less.

13. The semiconductor device of claim 7 wherein the dielectric which separates thee shelf portion from the substrate has a thickness on the order of 30 nm or less.

14. The semiconductor device of claim 7 further comprising a junction between the link region and the emitter region, the junction underlying the shelf portion of the emitter electrode.

* * * * *